United States Patent [19]
Douchi et al.

[11] Patent Number: 6,081,142
[45] Date of Patent: Jun. 27, 2000

[54] HOLD TIME MARGIN INCREASED SEMICONDUCTOR DEVICE AND ACCESS TIME ADJUSTING METHOD FOR SAME

[75] Inventors: Hiroko Douchi; Naoharu Shinozaki, both of Kawasaki, Japan

[73] Assignee: Fujitsu Limited, Kanagawa, Japan

[21] Appl. No.: 09/044,160

[22] Filed: Mar. 19, 1998

[30] Foreign Application Priority Data

May 14, 1997 [JP] Japan ................................. 9-124548

[51] Int. Cl.⁷ ............................................. H03L 7/06
[52] U.S. Cl. ................................. 327/158; 327/161
[58] Field of Search .................................... 327/141, 146, 327/149, 150, 153, 155, 158, 159, 160, 161, 276, 277, 278, 279, 284, 285, 286, 236, 237, 291, 292; 365/233

[56] References Cited

U.S. PATENT DOCUMENTS

| | | | |
|---|---|---|---|
| 4,922,141 | 5/1990 | Lofgren et al. ....................... | 327/158 |
| 5,087,829 | 2/1992 | Isgibashi et al. ..................... | 327/152 |
| 5,486,783 | 1/1996 | Baumert et al. ..................... | 327/147 |
| 5,670,903 | 9/1997 | Mizuno ................................ | 327/158 |
| 5,740,123 | 4/1998 | Uchida ................................ | 365/233 |
| 5,852,380 | 12/1998 | Yamauchi ........................... | 327/243 |

Primary Examiner—My-Trang Nu Ton
Attorney, Agent, or Firm—Arent, Fox, Kintner, Plotkin & Kahn

[57] ABSTRACT

A load adjusting circuit 36 adjusts the load value $L=L2$ of a dummy load circuit 31x corresponding to the outputs of a frequency determining circuit 37 and an interface determining circuit 35 as $L2=L1-\Delta L$ holding, where $L=L1$ is a proper value in the case that the access time does not depend on the frequency of the data DQ and $\Delta L$ corresponds to a half of the maximum value tlc of the deviation of the access time that varies corresponding to the frequency of the data DQ. A DLL circuit 40 delays a internal clock iCLK by a time $\delta tx$ so that a difference between phases of the clock iCLK and a dummy internal clock d_iCLK becomes a predetermined value. The delay time $\delta tx$ is equal to a value determined in such a way that $\delta tx=67\ tx0$ is determined with activating the DLL circuit 40, tlc is determined and $\delta tx$ is finally determined as $\delta tx=\delta tx0+$ tlc/2 or $\delta tx=\delta tx0-$tlc/2 due to the condition of data frequency at determining $\delta tx0$.

17 Claims, 14 Drawing Sheets

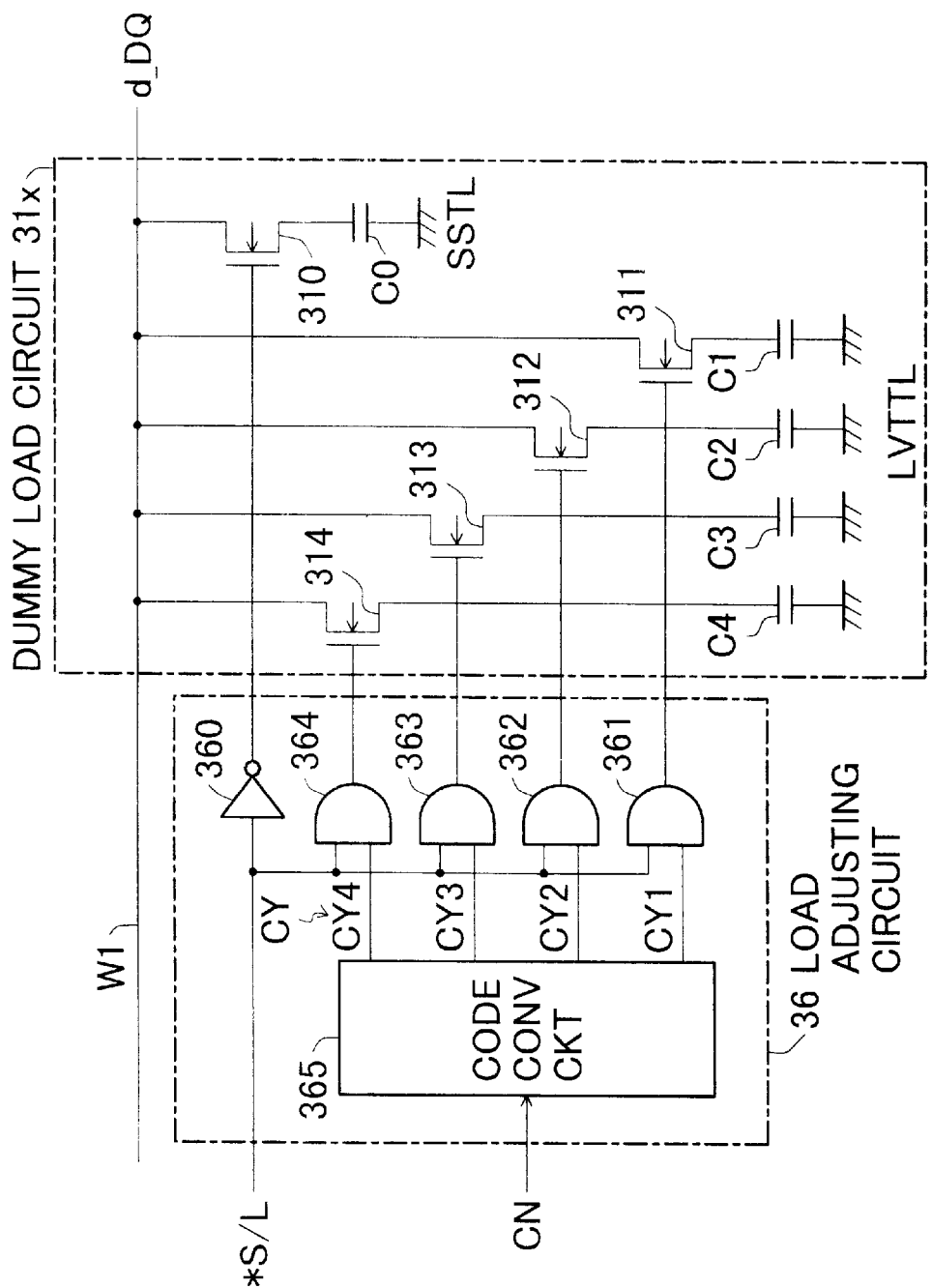

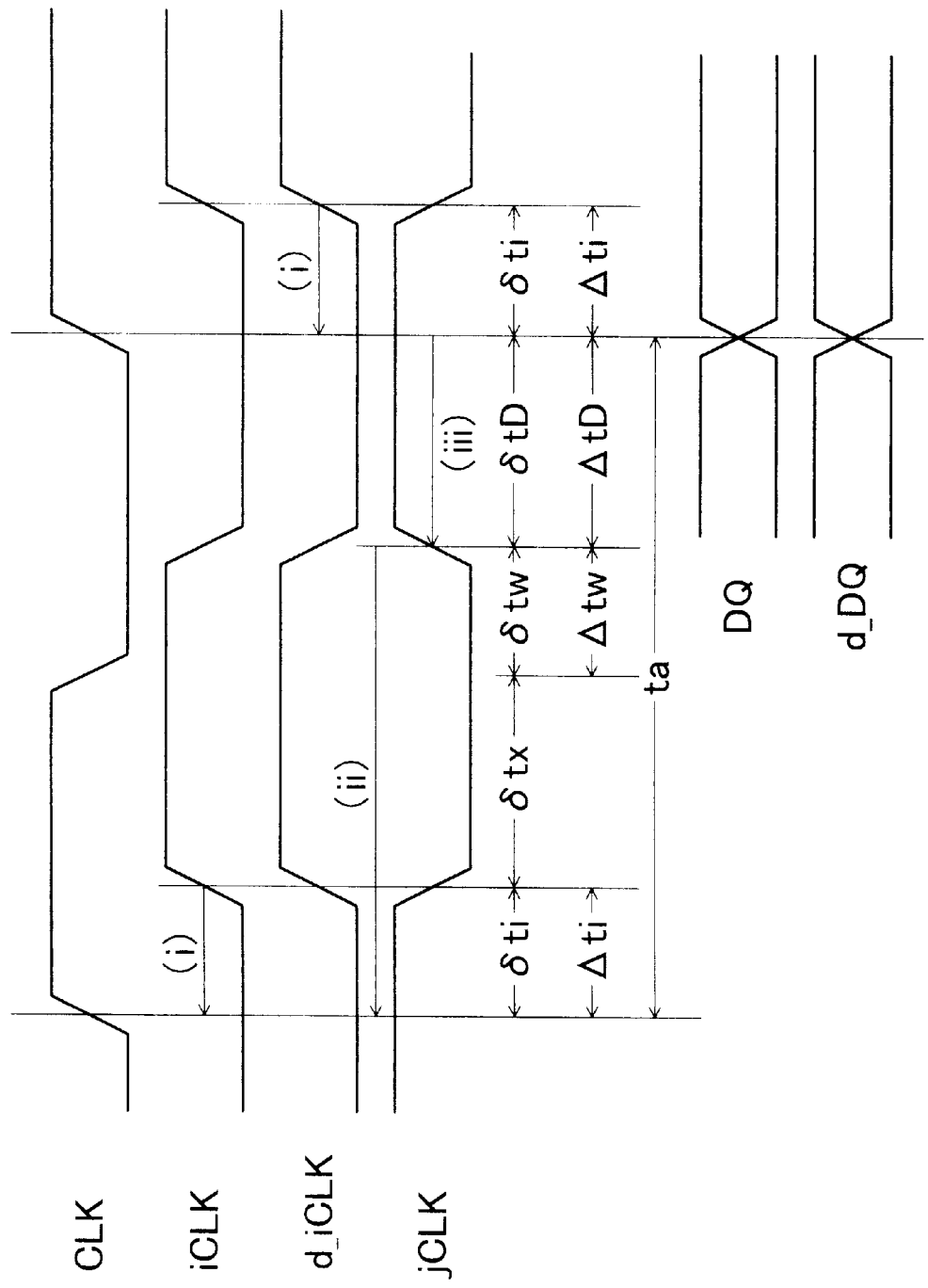

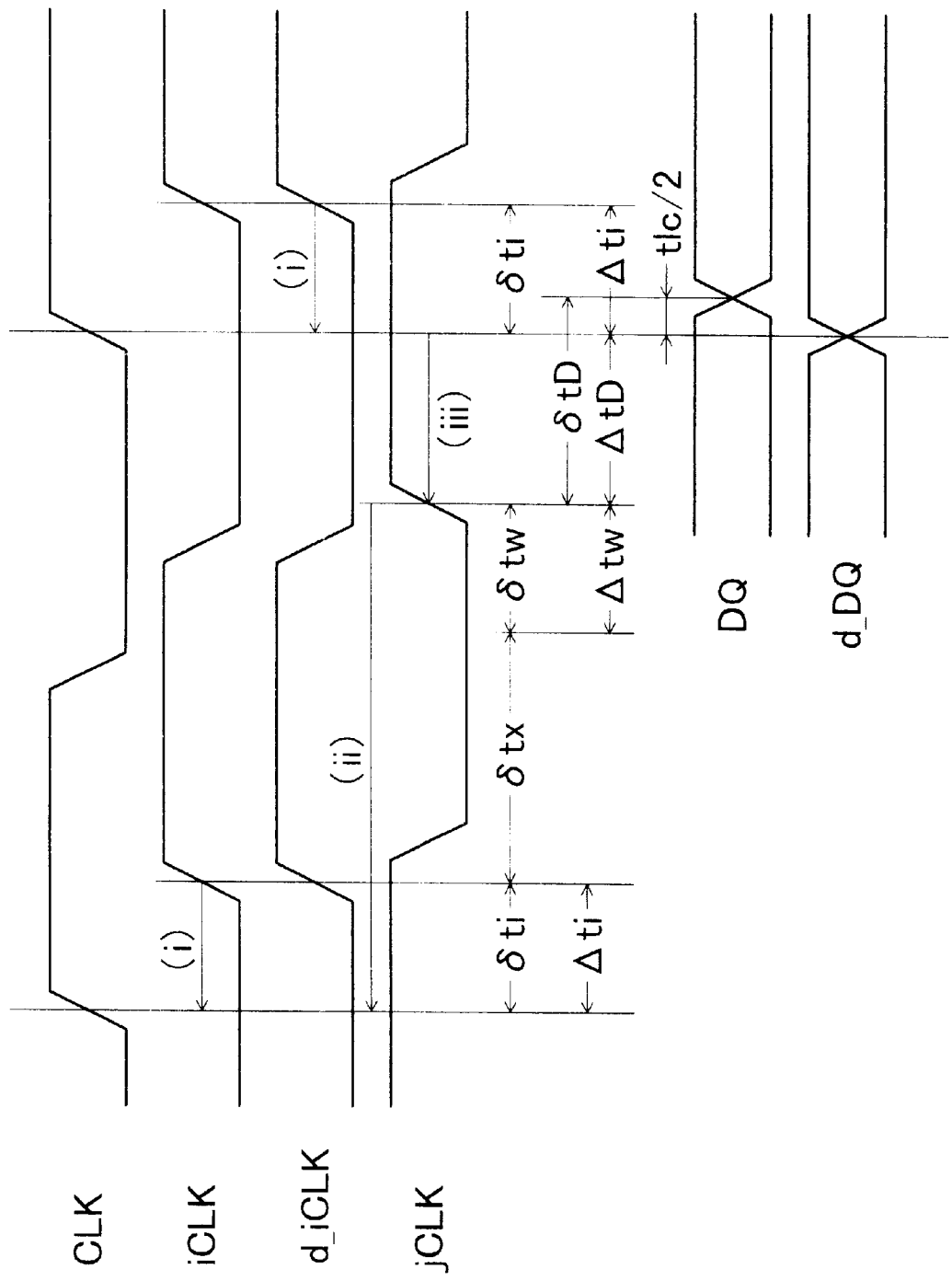

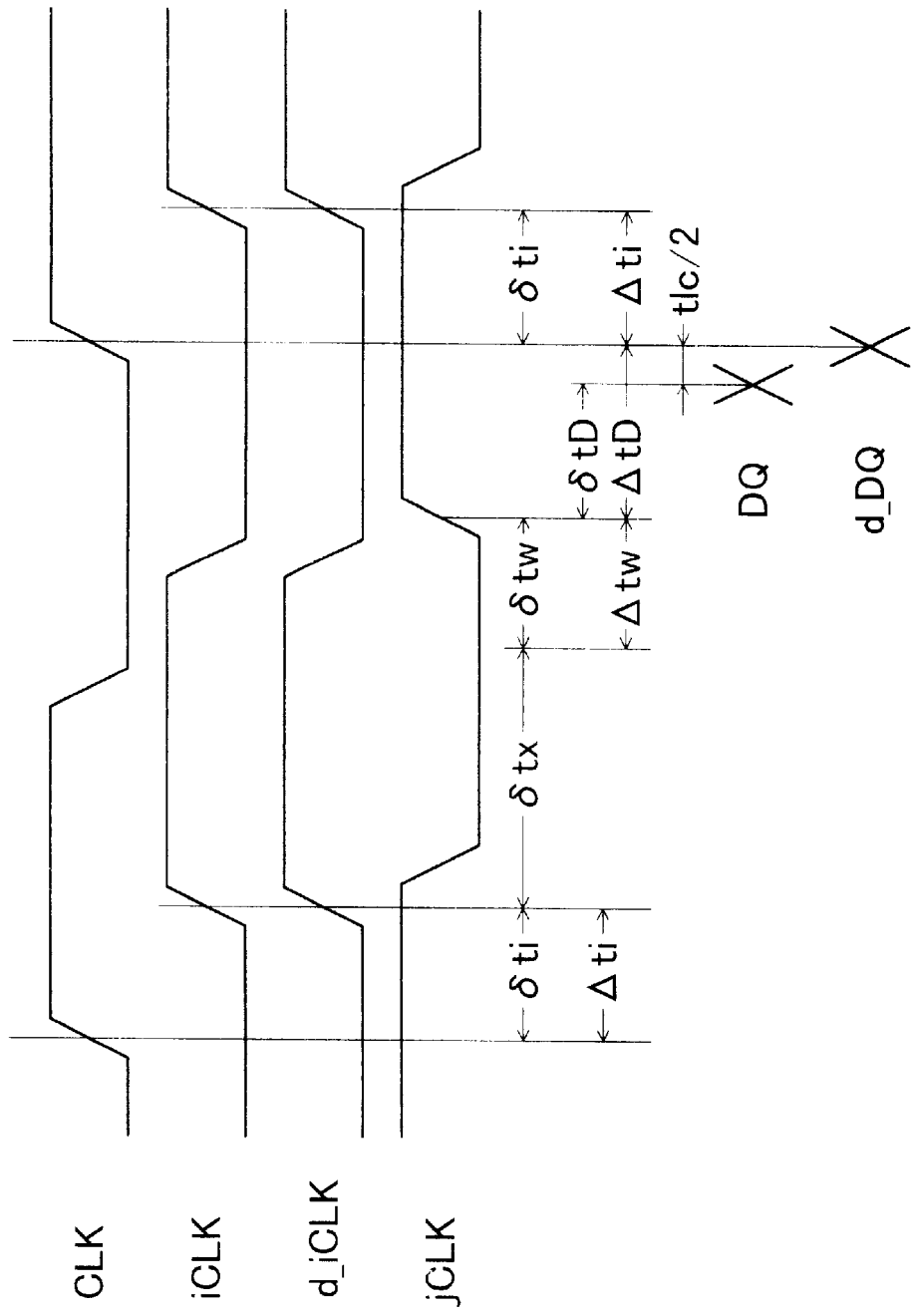

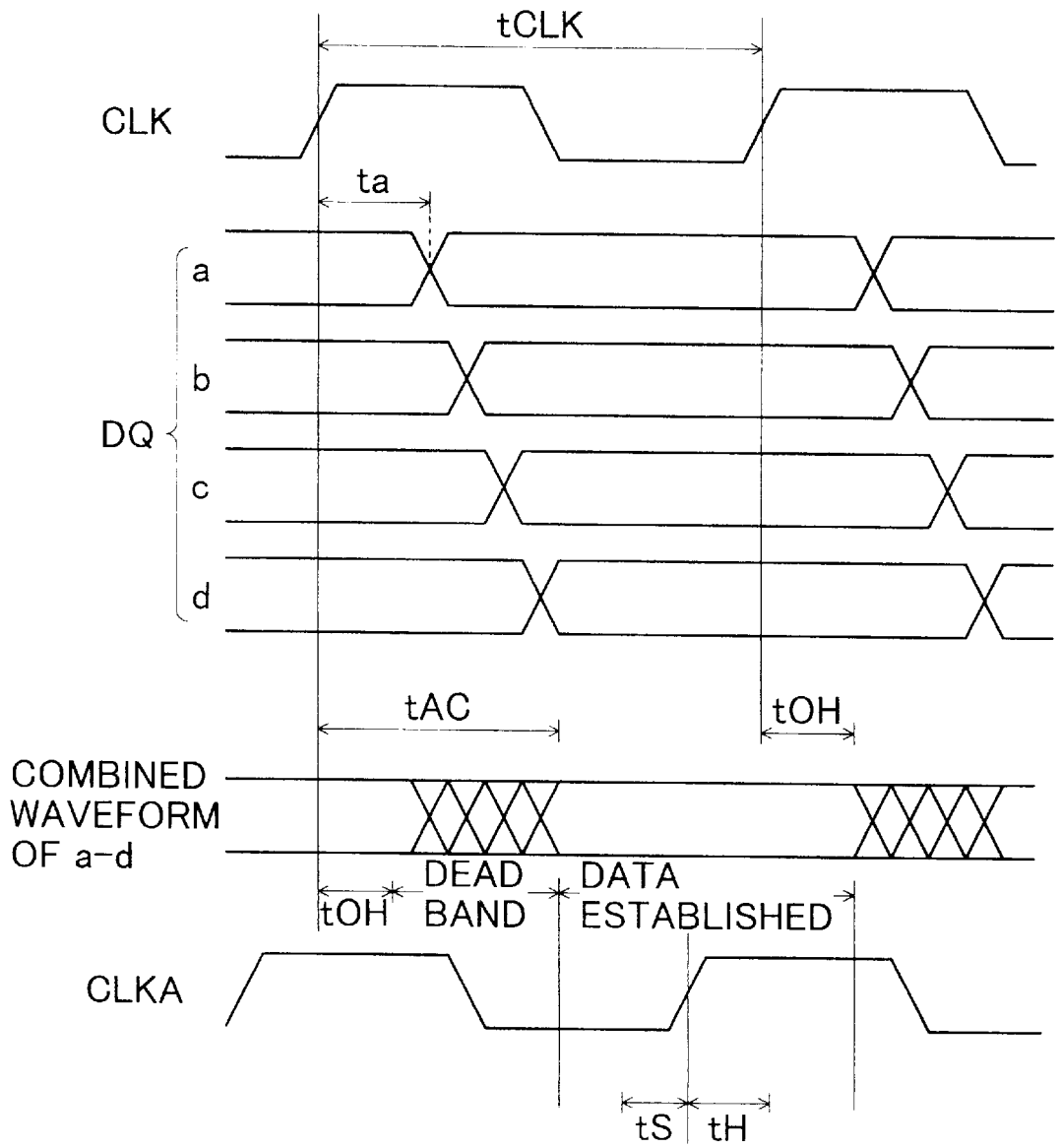

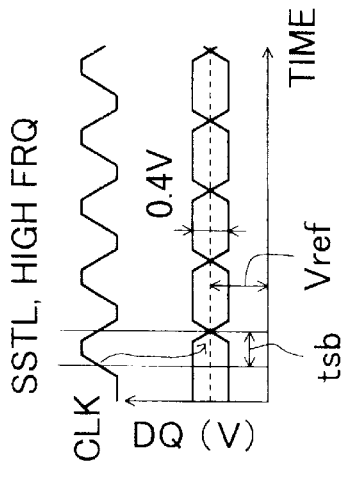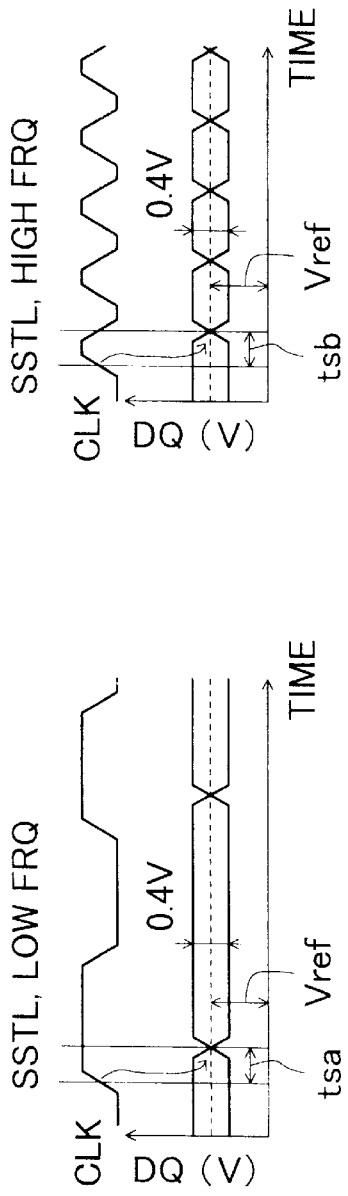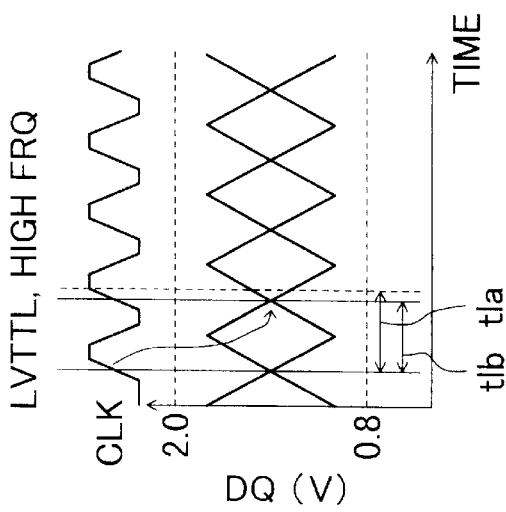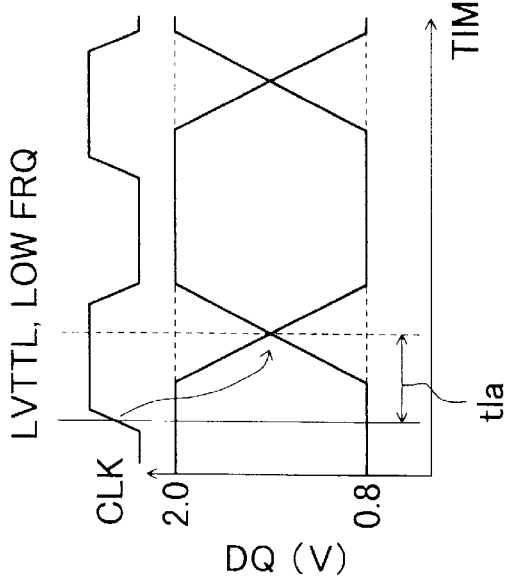
FIG.14(A) prior art
FIG.14(B) prior art
FIG.14(C) prior art
FIG.14(D) prior art

HOLD TIME MARGIN INCREASED SEMICONDUCTOR DEVICE AND ACCESS TIME ADJUSTING METHOD FOR SAME

BACKGROUND OF THE INVENTION

1. Field of the Invention

The present invention relates to a hold time margin increased semiconductor device and an access time adjusting method for the same.

2. Description of the Related Art

FIG. 10 shows a schematic block diagram of part of a prior art synchronous DRAM. In the following description, a negative logic signal corresponding to a positive logic signal A will be designated as *A.

With a row address decoded signal, a word line WL is activated to select a line in a cell array 10. Data read from the line is amplified by a sense amplifier 11. For instance, according to data read from a memory cell 12, a weak voltage takes place between a pair of bit lines BL and *BL and this voltage is amplified by the sense amplifier 11. Next, with a column address decoded signal, a column selecting line CL is activated to selectively turn on a switch in a column switch circuit 13, thereby a pair of bit lines BL and *BL are connected to a pair of data bus lines DB and *DB, respectively. Voltage on the data bus lines DB and *DB are amplified by data bus amplifier 14. When a switch circuit 15 is turned on, the data is transmitted to data bus controlling circuit 16. Further, when a switch circuit 17A is turned on, the data is transmitted to an I/O data buffer circuit 18A and outputted as data DQ from an external terminal.

Since data of one line in the cell array 10 has been amplified by the sense amplifier 11, when switches in the column switch circuit 13 are successively operated, data can be successively read. The switch circuit 13, the switch circuit 15, and the switch circuit 17A are operated in synchronization with a clock to transfer data in three stage pipelines. The column switch circuit 13 and the data bus amplifier 14 compose a first stage pipe 21. The switch circuit 15 and the data bus controlling circuit 16 compose a second stage pipe 22. The switch circuit 17A and the I/O data buffer circuit 18A compose a third stage pipe 23A. The pipes 21, 22, and 23A operate in synchronization with the clock received from a clock buffer circuit 24A. The clock is generated in such a way that an external clock CLK is amplified by a clock buffer circuit 24A and then properly delayed. A clock enable signal CKE is also provided to the clock buffer circuit 24A and the clock CLK is used in a circuit not shown when the clock enable signal CKE is active.

Each of the data bus controlling circuit 16 and the I/O data buffer circuit 18A has a flip-flop circuit, and assume that they store signal states "H" and "L", respectively and therefore the signal state of the data DQ is "L". The external clock CLK is amplified by the clock buffer circuit 24A and provided as an internal clock iCLK to a control input of the switch circuit 17A through a relatively long line. After the external clock CLK becomes "H", the internal clock iCLK becomes "H" and thus, the switch circuit 17A is turned on, "H" of the output of the data bus controlling circuit 16 is stored in the flip-flop circuit of the I/O data buffer circuit 18, the drive performance is further amplified and the data DQ becomes "H". In other words, the data DQ changes in an access time ta after the external clock CLK becomes "H".

FIG. 11 shows the structure of the third pipe 23A. In this structure, as an output interface of the SDRAM, one of SSTL and LVTTL interfaces can be selected.

The lower limit of "H" and the upper limit of "L" of the SSTL interface are Vref+0.4 V and Vref−0.4 V, respectively. The lower limit of "H" and the upper limit of "L" of the LVTTL interface are 2.4 V and 0.4 V, respectively.

In FIG. 11, although the voltages of output stages (CMOSs) of the SSTL interface and the LVTTL interface are 3.3 V, the above-described upper limit and lower limit of the voltages are satisfied since the driving performance of the output stage of the SSTL interface is different from that of the LVTTL interface and a current that is provided to an input circuit (not shown) connected to the output stages of the SSTL or LVTTL interface is around 16 mA or 2 mA, respectively.

The switch circuit 17A comprises inverters 171 and 172 and transfer gates 173 and 174. The I/O data buffer circuit 18A comprises inverters 181 to 185, a NAND gate 186, a NOR gate 187, a NAND gate 188, a NOR gate 189, and transistors 18a to 18d. The transistors 18a and 18c each are pMOSFETs and the transistors 18b and 18d each are nMOSFETs. Each of the transfer gates 173 and 174 consists of a pMOS transistor and an nMOS transistor that are connected in parallel.

When the SSTL interface is active, an interface determination signal S/L is "H". In this case, the NAND gate 186 and the NOR gate 187 function as an inverter and the output stage of the SSTL interface consisting of the transistors 18a and 18b becomes active. On the other hand, the output signals of the NAND gate 188 and the NOR gate 189 are fixed to "H" and "L", respectively, thus the transistors 18c and 18d are turned off and the output stage of the LVTTL interface consisting of the transistors 18c and 18d becomes a high impedance state at its output.

When the internal clock iCLK is "L", the transfer gates 173 and 174 are off. Assume that the states of the data bus controlling circuit 16 and the I/O data buffer circuit 18A are kept "L" and "H", respectively. In this case, the signals DAT1 and DAT2 are "H", the output signal of a flip-flop circuit FF1 consisting of the inverters 181 and 182 is "H", the output signal of a flip-flop circuit FF2 consisting of the inverters 183 and 184 is "H", the transistor 18a is on, the transistor 18b is off and the data DQ is "H".

When the internal clock iCLK goes "H" from above state, the transfer gates 173 and 174 are turned on and thereby the output signals of the flip-flop circuits FF1 and FF2 transit from "H" to "L". Thus, the transistor 18a is turned off, the transistor 18b is turned on and the date DQ transits to "L". Namely, the output data DQ changes in the access time ta after the external clock CLK becomes "H".

When the interface determination signal S/L is "L", the output stage of the SSTL interface becomes a high impedance state at its output and the output stage of the LVTL interface becomes active.

Like waveforms a to d of the output signal DQ shown in FIG. 13, the access time ta varies depending on the characteristics of the SDRAM and the variation of the power supply voltage and is not constant. In an overlaid waveform of a to d, a portion XXXX represents a dead band that cannot be used. An access time tAC is a duration after the clock becomes "H" to the end of the dead band (namely, until the data is settled). A data hold time tOH is a duration after the clock becomes "H" to the beginning of the dead band. Thus, the dead band is represented by (tAC−tOH). The dead band 0 (tAC=tOH) represents an ideal case. With designating a cycle time of the external clock CLK as tCLK, the data established time is represented as tCLK+tOH−tAC =tCLK−(dead band). For example, if the frequency of the external clock CLK is 100 MHZ, tCLK is 10 ns. Assuming that the duration of the dead band is 3 ns, the data established time is 7 ns.

When the data DQ is read to an input circuit of another semiconductor device in synchronization with a clock CLKA that has a certain relation to the phase of the external clock CLK, a setup time tS and a hold time tH are required, and the relation of tS+tH<(data established time) should be satisfied. In a normal input circuit, tS+tHO=about 3 ns. Thus, the remaining 4 ns is a margin time. However, when there are a plurality of data DQ, output timings vary among them. In addition, there are variations in signal delays on a circuit board mounting semiconductor devices. Moreover, the signal delays vary depending on the variation of the temperature and the external voltage. Thus, the margin time 4 ns is a very strict value. When the frequency of the external clock CLK is increased, the margin time becomes shorter.

Such a problem takes place with not only SDRAM, but the case that as shown in FIG. 12 a semiconductor device 31 is connected to an output of a semiconductor device 30A. An output circuit 23 and an input circuit 24 of the semiconductor device 30A correspond to the third stage pipe 23A and the clock buffer circuit 24A shown in FIG. 10, respectively.

Japanese Patent Application No. 8-339988, which assignee is the same as that of the present patent application, disclose a structure which can decrease the dead band due to the variation of the characteristics of SDRAM or the power supply voltage and so forth.

However, the present inventors have found that there were causes of a dead band that cannot be compensated by such a structure. The causes will be descried with reference to FIG. 14.

Each of FIGS. 14(A) to 14(D) shows that the data DQ is inverted in response to a rise of the external clock CKL.

FIG. 14(A) shows the case that data is outputted from the SSTL interface and is a low frequency signal.

FIG. 14(B) shows the case that data is outputted from the SSTL interface and is a high frequency signal.

FIG. 14(C) shows the case that data is outputted from the LVTTL interface and is a low frequency signal.

FIG. 14(D) shows the case that data is outputted from the LVTTL interface and is a high frequency signal.

In these cases, "high frequency" means that the frequency is so high as the dead band that cannot be compensated takes place, and "low frequency" means the reverse of that.

The access time ta in FIGS. 14(A) to 14(D) is designated as tsa, tsb, tla, and tlb, respectively. In the case of the SSTL interface and the amplitude of DQ being low, the relation of tsa=tsb is satisfied even if the data DQ is a high frequency since the data DQ can fully swing. In the case of the LVTTL interface, the relation tlb<tla is obtained when the data DQ is a high frequency since the data DQ cannot fully swing. In other words, in the LVTTL interface, since the access time tlb does not accord with the access time tla, the dead band (tAC−tOH) shown in FIG. 13 increases. Even if the data is outputted from the LVTTL interface with CLK of a high frequency, when the data DQ is a low frequency, for example, the data DQ varies "L", "L", "H", "H", "L", "L", . . . with CLK, the relation tla=tlb is satisfied. Namely, when the clock CLK is a high frequency, depending on an unpredicted frequency of the data DQ, the relation tlb<tla or the relation tlb=tla takes place. Thus, the margin of the hold time decreases by tla−tlb.

SUMMARY OF THE INVENTION

The present invention is made based on the above-described analysis by the present inventors.

An object of the present invention is to provide a semiconductor device which can increase the margin of a hold time that decreases in the case output data cannot fully swing and an access time adjusting method for this semiconductor device.

In the 1st aspect of the present invention, there is provided an access time adjusting method for a semiconductor device provided with an input circuit for providing a first internal clock in response to an external clock; a variable delay circuit for delaying the first internal clock by a delay time to provide a delayed first internal clock as a second internal clock; and an output circuit for outputting data in synchronization with the second internal clock, the method comprising the steps of: providing a dummy circuit having a dummy load for providing a delayed second internal clock in response to the second internal clock as a dummy clock; a phase comparator circuit for comparing a phase of the first internal clock with a phase of the dummy clock; and a delay adjusting circuit for adjusting the delay time so that a difference between the phases of the first internal clock and the dummy clock becomes a predetermined value; determining a value L2 of the dummy load as a value shifted by a shift value ΔL from a proper value L1 of the load in a case that an access time ta does not depend on a frequency of the data, where the shift value ΔL corresponds to substantially a half of a maximum value of deviations of the access time ta that varies corresponding to the frequency of the data; and activating the phase comparator circuit and the delay adjusting circuit to determine the delay time of the dummy circuit.

Consider the following four cases:

(1) The access time does not depend on the frequency of the output data under the condition that the value of the dummy load is equal to L1.

(2) The access time depends on the frequency of the output data under the condition that the value of the dummy load is equal to L1.

(3) The access time does not depend on the frequency of the output data under the condition that the value of the dummy load is smaller than L1 by ΔL.

(4) The access time depends on the frequency of the output data under the condition that the value of the dummy load is smaller than L1 by ΔL.

When the phase comparator circuit and phase adjusting circuit are activated and thereby the delay time of the delay circuit is adjusted, designating the access times in the case (1) and (2) as tla and tla−tlc, respectively, the access time in the case (3) is tla+tlc/2 and in the case (4) is tla−tlc/2.

Namely, according to the 1st aspect of the present invention, the margin of the hold time tH of FIG. 13 is increased by tlc/2 in comparison with the case that the value of the dummy load is not shifted by ΔL. Although, the margin of the setup time tS of FIG. 13 is increased by tlc/2 in comparison with the case that the dummy load is not shifted. However, since the margins of the time's tS and tH are balanced, the margin is substantially increased in comparison with the case that the value of the dummy load is not shifted. Thus, the yield of the circuit boards on which the semiconductor devices are mounted are improved.

Actually, due to a detection error of the phase comparator circuit, even in the case (1) or (3), a dead band is present and positive and negative jitters irregularly take place. On the other hand, according to the above-described shift ΔL, corresponding to the irregular variation of the frequency of the data, positive and negative jitters irregularly take place because of the access time ta+tlc/2 in the case (3) or ta−tlc/2 in the case (4). Thus, both the jitters may cancel out to each other. Oppositely, when the shift ΔL is not performed, corresponding to the irregular variation of the frequency of the data, a large negative jitter irregularly takes place in the output data because tlc of the access time ta in the case (1) or ta–tlc in the case (2), where tlc depends on this frequency. Thus, the dead band can be decreased in comparison with the case that the dummy load is not shifted.

In the 2nd aspect of the present invention, there is provided an access time adjusting method for a semiconductor device provided with an input circuit for providing a first internal clock in response to an external clock; a variable delay circuit for delaying the first internal clock by a delay time to provide a delayed first internal clock as a second internal clock; and an output circuit for outputting data in synchronization with the second internal clock, the method comprising the steps of: providing a dummy circuit having a dummy load for providing a delayed second internal clock in response to the second internal clock as a dummy clock; a phase comparator circuit for comparing a phase of the first internal clock with a phase of the dummy clock; and a delay adjusting circuit for adjusting the delay time so that a difference between the phases of the first internal clock and the dummy clock becomes a predetermined value; determining the delay time as a first value with activating the phase comparator circuit and the delay adjusting circuit; determining a maximum value of deviations of an access time ta that varies corresponding to a frequency of the data; and determining the delay time as a value shifted by substantially a half of the maximum value from the first value.

The shifted value is plus when the 1st value is determined under the condition that the access time of the output data does not depend on its frequency, and minus in reverse case.

In the 3rd aspect of the present invention, there is provided a semiconductor device comprising: an input circuit for providing a first internal clock in response to an external clock; a variable delay circuit for delaying the first internal clock by a delay time to provide a delayed first internal clock as a second internal clock; and an output circuit for outputting data in synchronization with the second internal clock; wherein the delay time is substantially equal to a value determined in such a way that the delay time is determined as a first value with activating a delay locked loop circuit including the variable delay circuit, a maximum value of deviations of an access time ta that varies corresponding to a frequency of the data is determined and the delay time is determined as a value shifted by substantially a half of the maximum value from the first value.

In the 4th aspect of the present invention, there is provided a semiconductor device comprising: an input circuit for providing a first internal clock in response to an external clock; an output circuit for outputting data in synchronization with a second internal clock; and a dummy circuit having a dummy load for providing a delayed second internal clock in response to the second internal clock as a dummy clock; and a delay locked loop circuit for delaying the first internal clock by a delay time so that a difference between phases of the first internal clock and the dummy clock becomes a predetermined value and for providing a delayed first internal clock as the second internal clock, wherein the delay time is substantially equal to a value determined in such a way that the delay time is determined as a first value with activating the delay locked loop circuit, a maximum value of deviations of an access time ta that varies corresponding to a frequency of the data is determined and the delay time is determined as a value shifted by substantially a half of the maximum value from the first value.

In the 5th aspect of the present invention, there is provided a semiconductor device as defined in the 4th aspect, further comprising: a frequency determining circuit for determining a frequency of the external clock CLK; and a load adjusting circuit for adjusting a value of the dummy load corresponding to the determined frequency.

In the 6th aspect of the present invention, there is provided a semiconductor device as defined in the 5th aspect, wherein the frequency determining circuit includes: a monostable multivibrator; and a counter for counting a clock while an output of the monostable multivibrator is active.

In the 7th aspect of the present invention, there is provided a semiconductor device as defined in the 6th aspect, wherein the dummy circuit includes: a plurality of load elements, and a switching circuit for selecting a combination of the load elements to determine a value of the dummy load, wherein the load adjusting circuit includes: a code converting circuit for converting a count of the counter; and a logic circuit for controlling the switching circuit corresponding to an output value of the code converting circuit.

In the 8th aspect of the present invention, there is provided a semiconductor device as defined in the 5th aspect, wherein the output circuit includes a plurality of output interface circuits to be selected, the semiconductor device further comprise an interface determining circuit for determining a selected one from the output interface circuits, and wherein the load adjusting circuit adjusts the value of the dummy load corresponding to outputs of the frequency determining circuit and the interface determining circuit.

According to the 8th aspect of the present invention, the above shift is performed for any selected interface.

In the 9th aspect of the present invention, there is provided a semiconductor device as defined in the 4th aspect, wherein the dummy circuit includes: a dummy output circuit with a delay time that is substantially equal to that of the output circuit; a dummy load circuit having the dummy load; and a dummy input circuit with a delay time that is substantially equal to that of the input circuit; wherein the dummy output circuit, the dummy load circuit and the dummy input circuit are cascaded.

According to the 9th aspect of the present invention, even if the process condition of production varies, the 1st delay time of the delay circuit can be properly shifted.

In the 10th aspect of the present invention, there is provided a semiconductor device according the 4th aspect, wherein the delay locked loop circuit includes: a phase comparator circuit for detecting whether the phase of the dummy clock advances to, delays from, or matches with the phase of the first internal clock; a variable delay circuit for delaying the first internal clock by the delay time to provide a delayed first internal clock as the second internal clock; and a delay adjusting circuit for adjusting so that the phase comparator detects matching.

In the 11th aspect of the present invention, there is provided a semiconductor device comprising: an input circuit for providing a first internal clock in response to an external clock; an output circuit for outputting data in synchronization with a second internal clock; and a dummy circuit having a dummy load for providing a delayed second internal clock in response to the second internal clock as a dummy clock; and a delay locked loop circuit for delaying the first internal clock by a delay time so that a difference between phases of the first internal clock and the dummy clock becomes a predetermined value and for providing a delayed first internal clock as the second internal clock, wherein a value of the dummy load depends on a frequency of the external clock.

Other aspects, objects, and the advantages of the present invention will become apparent from the following detailed description taken in connection with the accompanying drawings.

BRIEF DESCRIPTION OF DRAWINGS

FIG. 2 is a schematic diagram showing an embodiment of a dummy load circuit and a load adjusting circuit of FIG. 1;

FIG. 6 is a time chart showing an operation of the circuit of FIG. 1 at the adjustment having been completed;

FIG. 7 is a time chart showing another operation of the circuit of FIG. 1 at the adjustment having been completed;

FIG. 9 is a time chart corresponding to FIG. 7, according to a second embodiment of the present invention;

FIG. 13 is a time chart for explaining a problem of the semiconductor device of FIG. 10 or 12;

FIG. 14(A) is a schematic diagram showing waveforms of a clock CLK and data DQ in the case data is outputted from an SSTL interface in a low frequency;

FIG. 14(B) is a schematic diagram showing waveforms of a clock CLK and data DQ in the case data is outputted from the SSTL interface in a high frequency;

FIG. 14(C) is a schematic diagram showing waveforms of a clock CLK and data DQ in the case data is outputted from a LVTTL interface in a low frequency; and FIG. 14(D) is a schematic diagram showing waveforms of a clock CLK and data DQ in the case data is outputted from the LVTTL interface in a high frequency.

DESCRIPTION OF PREFERRED EMBODIMENTS

Figure 1:
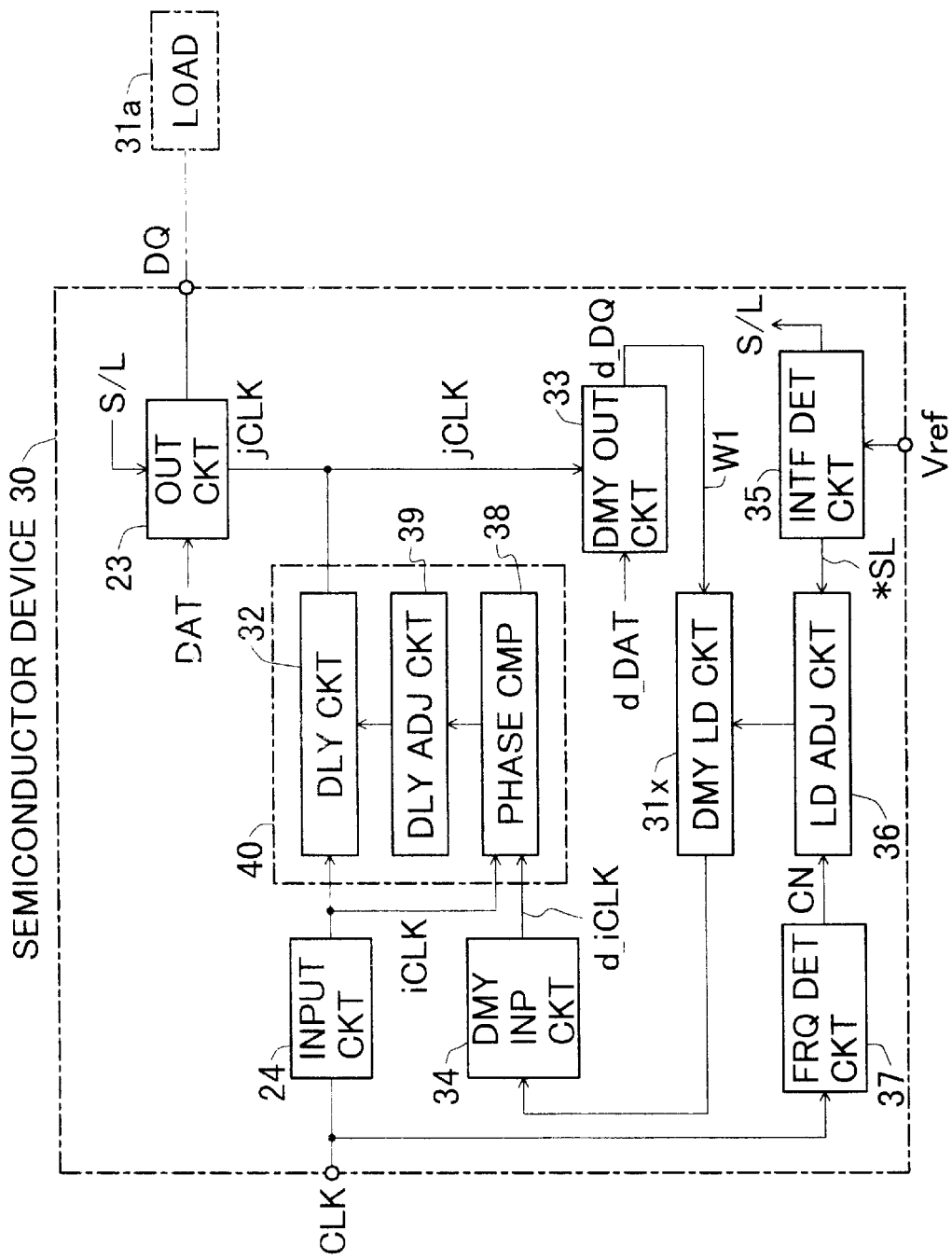
FIG. 1 is a schematic block diagram showing a semiconductor device according to a first embodiment of the present invention.

Referring now to the drawings, wherein like reference characters designate like or corresponding parts throughout several views, preferred embodiments of the present invention are described below.

First Embodiment

FIG. 1 shows a portion relating to an output circuit 23 of a semiconductor device 30. The output circuit 23 is structured, for example, as the third pipe 23A shown in FIG. 11. Data DAT is provided to the output circuit 23, held in synchronization with an internal clock jCLK provided to the control input thereof and outputted as data DQ to an external output terminal to which a load 31a is connected. The load 31a denotes the sum of a load at an input stage of the semiconductor device 31 shown in FIG. 12 and a load of a connecting line between semiconductor devices, and the value of the load 31a varies depending on the type of the interface.

An input circuit 24 has a electrostatic protection circuit and a buffer circuit for amplifying a signal driving performance, and amplifies the provided external clock CLK and outputs it as an internal clock iCLK. The clock iCLK is delayed by a variable delay circuit 32 and outputted therefrom as an internal clock jCLK.

The signal delay times in the input circuit 24 and the delay circuit 32 are designated as $\delta ti$ and $\delta tx$, respectively. The signal delay time due to the line from the input terminal of the external clock CLK to the clock input of the output circuit 23 excluding the input circuit 24 and the delay circuit 32 is designated as $\delta tw$. The delay time after the internal clock jCLK becomes "H" until the changed data DAT is transmitted to the external output terminal of the data DQ or a near end of the load 31a is designated as $\delta tD$. The access time ta (ref. tAC of FIG. 13) is the sum of these times, namely as follows.

$$ta = \delta ti + \delta tw + \delta tD + \delta tx.$$

If $\delta tx = 0$, the access time ta varies depending on the characteristics of SDRAM and the variation of the power supply voltage, and is not constant. However, it is possible in principle to make the dead band zero by properly adjusting the variable delay time $\delta tx$. Other than the above-described circuits of FIG. 1 are used to properly adjust the variable delay time $\delta tx$.

The semiconductor device 30 has a dummy input circuit 34, a dummy output circuit 33 and a dummy load circuit 31x corresponding to the input circuit 24, the output circuit 23 and the load 31a, respectively. The internal clock jCLK is provided to the control input of the dummy output circuit 33 corresponding to the control input of the output circuit 23. Dummy data d_DAT is provided to the data input of the dummy output circuit 33. An output signal of the dummy output circuit 33 is provided through the dummy load circuit 31x to the dummy input circuit 34. A delay time $\Delta tl$ of the dummy input circuit 34 is designed to match the delay time $\delta ti$ of the input circuit 24. The delay time of the dummy output circuit 33 is designed to match the delay time of the output circuit 23. For instance, the dummy circuits 34 and 33 consist of the same circuits as or similar circuits to the circuits 24 and 23, respectively. A total delay time $\Delta tD$ of the dummy output circuit 33 and the dummy load circuit 31x corresponds to $\delta tD$. A delay time due to the line at the dummy circuits corresponding to the delay time $\delta tw$ due to the line is designated as $\Delta tw$. The delay time $\Delta tw$ is designed to accord with the signal delay $\delta tw$.

An embodiment of the dummy load circuit 31x is shown in FIG. 2.

Drains of nMOS transistors 310 to 314 are connected to a line W1. Capacitors C0 to C4 are connected between sources of the nMOS transistors 310 to 314 and a ground line, respectively. The capacitors C0 to C4 are, for example, MOS capacitors. Corresponding to the on/off states of the nMOS transistors 310 to 314, the load value of the dummy load circuit 31x is determined.

Figure 11:
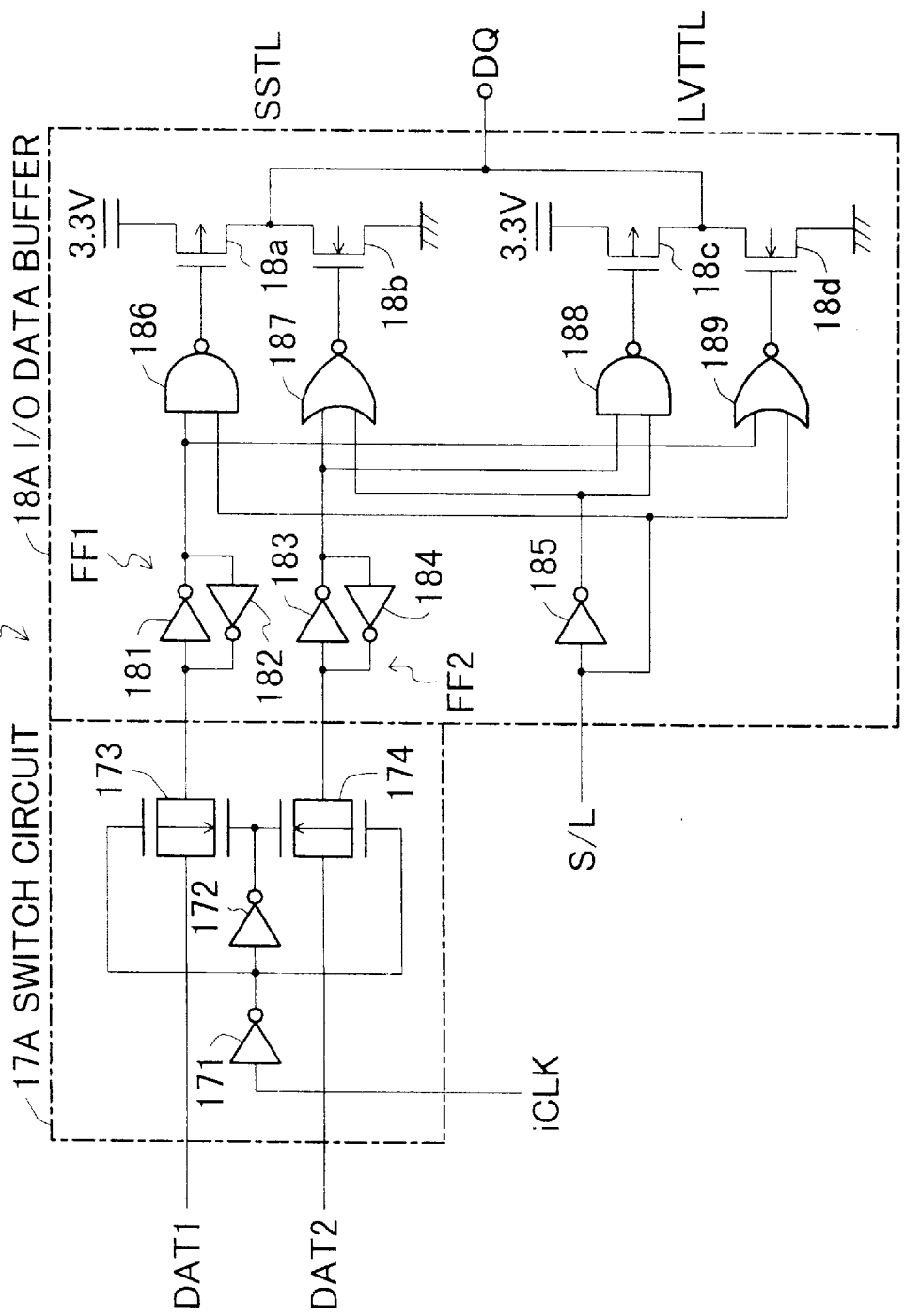
FIG. 11 is a circuit diagram showing a prior art third stage pipe of FIG. 10.
Figure 12:
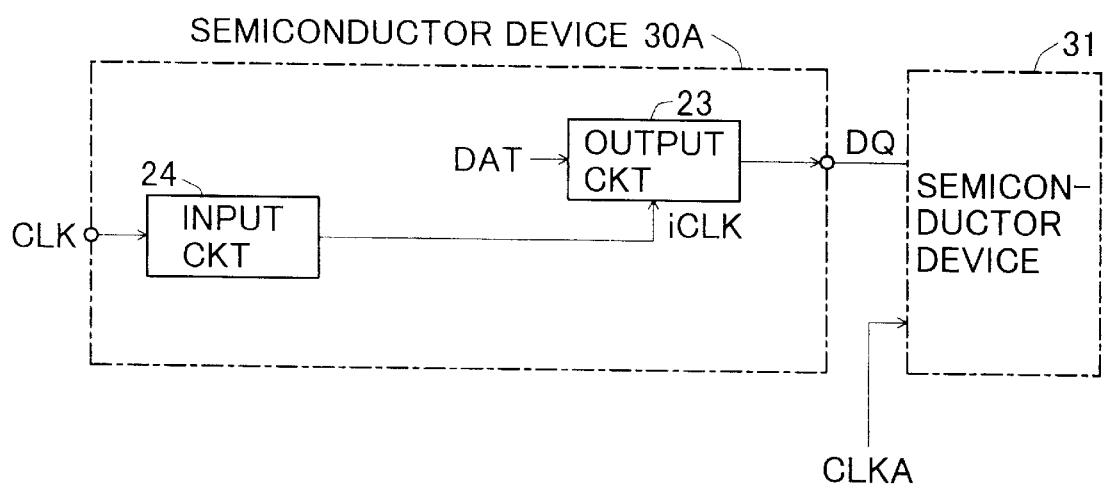
FIG. 12 is a schematic block diagram showing a prior art semiconductor device to which the present invention can be applied.

In FIG. 1, in the case of the SSTL interface, a reference voltage for determining whether an input signal to a data input circuit (not shown) is "L" or "H" is provided to a Vref pin. The reference voltage is, for example, 1.65 V. In the case of the LVTTL interface, a power supply voltage 3.3 V or a 0 V is provided to the Vref pin. Therefor, depending on whether or not the reference voltage is applied to the Vref pin, an interface determining circuit 35 determines the type of the selected interface. For example, if the voltage of the Vref pin is lower than a set value, the interface determining circuit 35 determines that the SSTL interface is selected and drives a line of an interface determination signal S/L high. Otherwise, the interface determining circuit 35 determines that the LVTTL interface is selected and drives the line of the interface determination signal S/L low. The interface determination signal S/L is provided to the output circuit 23 (ref. FIG. 11). Thereby, the interface of the output stage of the output circuit 23 is selected. In response to the interface determination signal *S/L, the load adjusting circuit 36 adjusts the load of the dummy load circuit 31x so that the signal delay time due to the load of the dummy load circuit 31x becomes equal to that of the standard load 31a with exceptions that will be described later.

An embodiment of the load adjusting circuit 36 is shown in FIG. 2.

The output and input of an inverter 360 are connected to the gate of the nMOS transistor 310 and to one input of each of AND gates 361 to 364, respectively. The outputs of the AND gates 361 to 364 are connected to the gates of the nMOS transistors 311 to 314, respectively. The interface determination signal S/L is provided to an input of the inverter 360. The bits CY1 to CY4 of dummy load adjustment data are provided to the other inputs of the AND gates 361 to 364, respectively. A code converting circuit 365 converts frequency determination data CN that is outputted from the frequency determining circuit 37 of FIG. 1 into the dummy load adjustment data.

When the interface determination signal *S/L is "L", namely the output stage of the output circuit 23 is the SSTL interface, all the output signals of the AND gates 361 to 364 are "L", thereby the nMOS transistors 311 to 314 are off. On the other hand, the nMOS transistor 310 is on and thereby the line W1 is connected to the capacitor C0. The capacitor C0 is designed in such a way that the delay time of the dummy load circuit 31x becomes equal to the delay time by a standard load 31a of FIG. 1 in the case of the SSTL interface.

When the interface determination signal *S/L is "H", namely the output stage of the output circuit 23 is the LVTTL interface, the nMOS transistor 310 is off and the AND gates 361 to 364 are opened. When the frequency of the external clock CLK is so low as the data DQ inverted with each pulse of the external clock CLK can fully swing, in other words, the data DQ is in a low frequency, all the bits CY1 to CY4 become "H" and thereby the capacitors C1 to C4 are connected to the line W1. In this state (the maximum load state of the LVTTL interface), the delay time of the dummy load circuit 31x is designed to become equal to the delay time by a standard load 31a of FIG. 1 in the case of the LVTTL interface.

An operation in the case that the frequency of the external clock CLK is so high as the data DQ inverted with each pulse of the external clock CLK can not fully swing, namely the data DQ is in a high frequency will be described later.

Figure 3A:
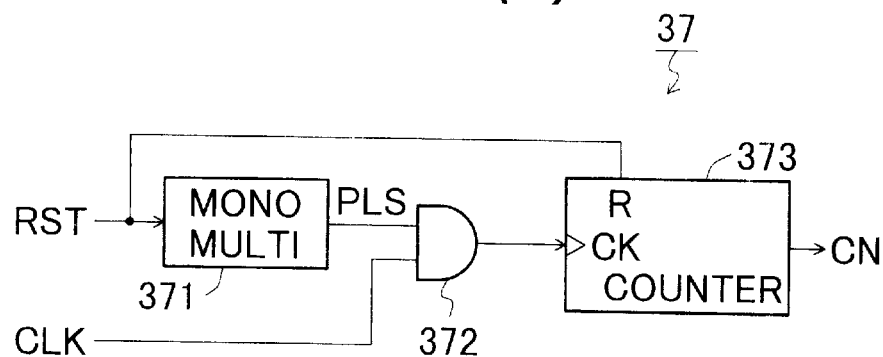
FIG. 3(A) is a schematic diagram showing an embodiment of a frequency determining circuit of FIG. 1.
Figure 3B:
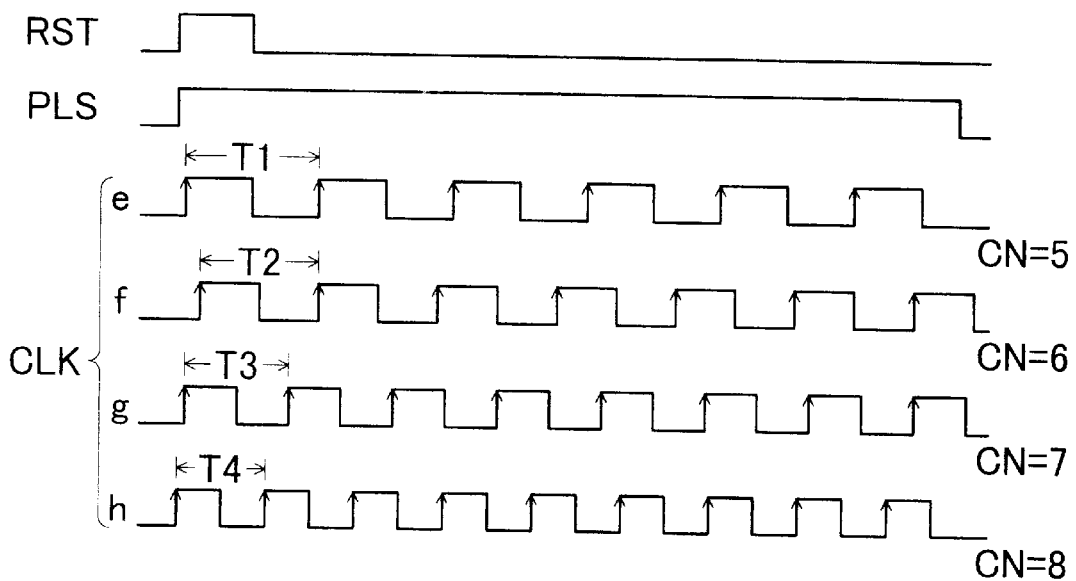
FIG. 3(B) is a time chart showing the operation of the frequency determining circuit.

FIG. 3(A) shows an embodiment of the frequency determining circuit 37. FIG. 3(B) shows waveforms of a reset pulse RST and a mono-pulse PLS and waveforms e to h of the external clock CLK, in FIG. 3(A).

The frequency determining circuit 37 determines the frequency of the external clock CLK and outputs the determined result as a frequency determination signal CN.

A monostable multivibrator 371 is triggered with the reset pulse RST to output a mono-pulse PLS with a predetermined pulse width. Thereby, an AND gate 372 is opened, pulses of the external clock CLK go through the AND gate 372 and are counted by a counter 373. The frequency determination signal CN that is a count of the counter 373 is reset with the reset pulse RST. In the waveforms e to h (cycle times T1 to T4) of the external clock CLK shown in FIG. 3(B), the values of the frequency determination signal NC are 5 to 8, respectively.

In FIG. 1, outputs iCLK and d_iCLK of the input circuit 24 and the dummy input circuit 34 are provided to a phase comparator circuit 38 which detects whether the phase of the dummy internal clock d_iCLK advances to, matches with, or delays from the phase of the internal clock iCLK. FIG. 4(B) shows the relation of the phases of the clocks iCLK and d_iCLK. In response to the detected result, the delay adjusting circuit 39 controls the delay time of the delay circuit 32 so that the difference between the phases of the clocks iCLK and d_iCLK becomes a predetermined value, for example, zero.

The delay circuit 32, the phase comparator circuit 38 and the delay adjusting circuit 39 constitutes a so-called DLL (Delay Locked Loop) circuit 40.

Figure 4A:
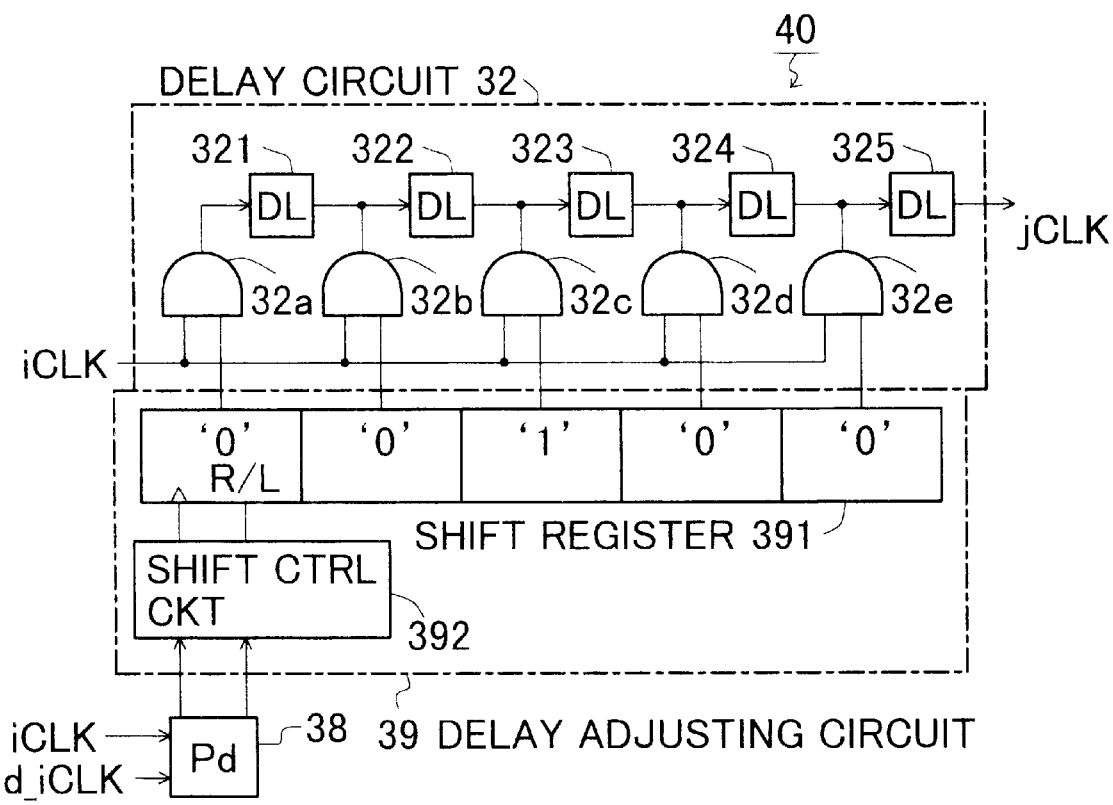
FIG. 4(A) is a schematic diagram showing a DLL circuit of FIG. 40.
Figure 4B:
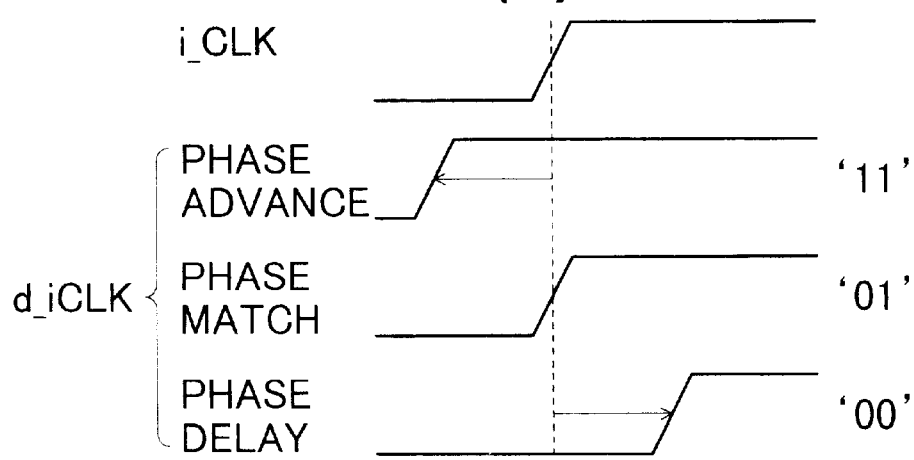
FIG. 4(B) is a time chart showing an input signal of a phase comparator circuit.

FIG. 4(A) shows an embodiment of the DLL circuit 40. In the variable delay circuit 32, delay elements 321 to 325 having the same structure are cascaded. For instance, the delay element 321 consists of two cascaded inverters. The inputs of the delay elements 321 to 325 are connected to the outputs of AND gates 32a to 32e, respectively. The internal clock iCLK is provided to one input of each of the AND gates 32a to 32e . The first to fourth output bits of a four-bit shift register 391 of the delay adjusting circuit 39 are connected to the other inputs of the AND gates 32a to 32e, respectively.

When "00100" is stored in the shift register 391 as shown in FIG. 4(A), only the AND gate 32c of the AND gates 32a to 32e is open. The internal clock iCLK is transmitted through the AND gate 32c to the delay elements 323 to 325 and outputted as the internal clock jCLK.

As shown in FIG. 4(B), when the phase of the dummy internal clock d_iCLK delays from, matches with, and substantially matches with the phase of the internal clock iCLK, the phase comparator circuit 38 outputs for example "00", "01", and "11", respectively. The shift register 391 is reset to, for instance, "10000" at the time of turning on the power supply. When the phase of the dummy internal clock d_iCLK delays from the phase of the internal clock iCLK, the shift controlling circuit 392 shifts the bits of the shift register 391 rightward in FIG. 4(A) until both the phases match with. During this shift, "0" is set to the first bit (the left end bit in FIG. 4) of the shift register 391. When the phase of the dummy internal clock d_iCLK advances from the phase of the internal clock iCLK, the shift controlling circuit 392 shifts the bits of the shift register 391 leftward in FIG. 4(A) until both the phases match with. During this shift, "0" is set to the fifth bit (the right end bit in FIG. 4) of the shift register 391.

Figure 5:
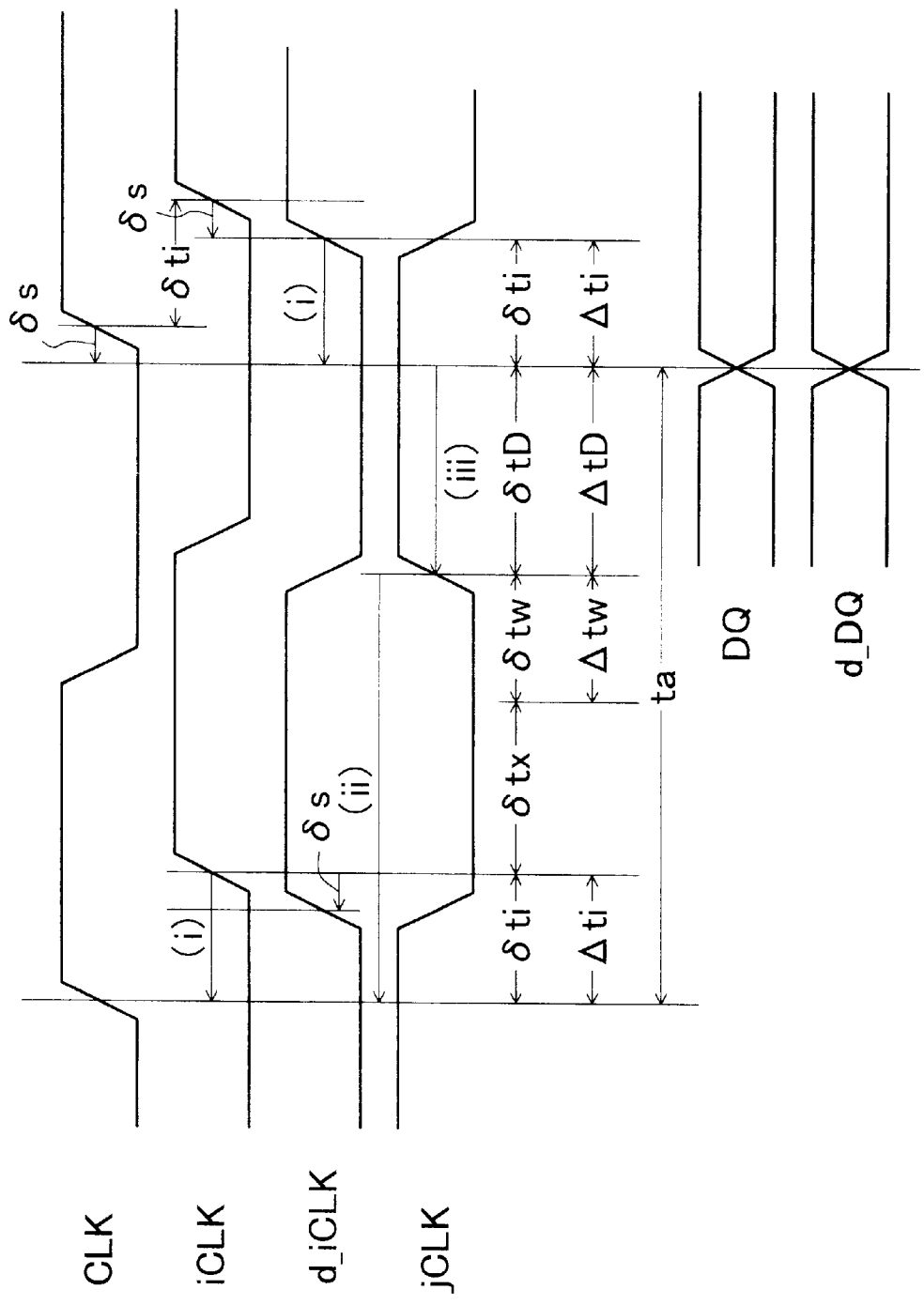
FIG. 5 is a time chart showing an operation of the circuit of FIG. 1 in adjusting.

FIGS. 5 and 6 are time charts showing the operation of the circuit of FIG. 1 in a low frequency in the case the data DQ varies in response to the rise of the external clock CLK. FIG. 5 shows the case that the phase of the internal dummy clock d_iCLK advances from that of the internal clock iCLK by a time δs. FIG. 6 shows the case that both phases accord because of the adjustment of the variable delay time δtx.

In FIG. 1, adjusting of the delay time of the delay circuit 32 is performed when the output data DQ is not used, for example, when the reset pulse RST is provided (initializing period). The adjustment value is fixed until the power is turned off or the reset pulse RST is provided. The signal states of the dummy data d_DQ and the data DAT is inverted at every m pulses (m≧1) of the external clock CLK. For instance, the dummy data d_DAT is generated by triggering the T flip-flop with a clock whose frequency is m times higher than that of the external clock CLK. Alternatively, the dummy data d_DAT may be fixed to "L" or "H" and the output data d_DQ of the dummy output circuit 33 may be inverted at every m pulses of the internal clock jCLK.

(A) Delay Time Adjustment Operation of Delay Circuit 32 in the Case that Data DQ Fully Swings In FIGS. 5 and 6, the data DQ varies after the time δtD from the internal clock jCLK becoming "H". The dummy internal clock d_iCLK becomes "H" after a time Δti from the data DQ varying since the output data of the dummy load circuit 31x is provided to the dummy input circuit 34. When the delay adjusting circuit 39 has controlled the delay time of the delay circuit 32 so that the difference between the phases of the clocks iCLK and d_iCLK becomes 0, as shown in FIG. 6, the clocks iCLK and d_iCLK rise at the same time. When the phase of the dummy internal clock d_iCLK advances to the internal clock iCLK by time δs, the internal clock iCLK rises after the time δs from the rise of the dummy internal clock d_iCLK.

From FIGS. 5 and 6, the following (i) to (iii) hold. (i) Tracing back by time δti starting from the rise of the internal clock iCLK, the rise of the external clock CLK would arise, and tracing back by time Δti starting from the rise of the dummy internal clock d_iCLK, the change of the dummy output d_DQ would arise. (ii) Tracing back by time (δtw+δtx+δti) along the delay circuit 32 and the input circuit 24 starting from the rise of the internal clock jCLK at the control input of the dummy output circuit 33, the rise of the external clock CLK would arise. (iii) Tracing back by time ΔtD starting from the change of the dummy output data d_DQ, internal clock jCLK would arise.

From above, it is concluded that the external clock CLK will rise after time δs from the change of the output data DQ.

Accordingly, the difference between the phases of the data DQ and the external clock CLK becomes zero in principle even if there is a variation in the characteristics of the semiconductor device 30 or the power supply voltage. In actual fact, due to an error of the phase match determination at the phase comparator circuit 38, the phase difference does not become zero perfectly. However, the dead band can be decreased since the phase difference is substantially constant. If the delay of the delay circuit 32 is adjusted so that the phase difference detected by the phase comparator circuit 38 becomes a predetermined value other than 0, for example, π, the phase difference between the data DQ and the external clock CLK can be adjusted to a corresponding value other than zero.

(B) Problem

In spite of the above adjustment, in the case that the load of the LVTTL interface in the dummy load circuit 3.lx is fixed at the value of the above-described maximum load, the following problem takes place.

When the external clock is a high frequency, since the data DQ cannot fully swing as shown in FIG. 14(D), the access time tlb becomes shorter than the access time tla in the case that the data DQ can fully swing. Even if the external clock CLK is a high frequency, when the data DQ is such a low frequency that it can fully swing, the access time becomes tla. However, in the actual operation after the adjustment, the frequency of the data DQ unpredictably varies. Therefore, the margin of the hold time tH shown in FIG. 13 is decreased by tlc=tla−tlb if the adjustment is performed in the state that both the data DQ and the dummy data d_DQ can fully swing. The higher the frequency of the external clock CLK is, the longer the time tlc is.

Conversely, if the adjustment is performed in the state that both the data DQ and the dummy data d_DQ can not fully swing, the access time becomes tlb. However, in the actual operation after the adjustment, when the frequency of the data DQ has decreased so that it can fully swing, the access time becomes tlb+tlc. As a result, the margin of the setup time tS shown in FIG. 13 decreases by tlc.

If one of the margin of the hold time tH and the setup time tS becomes zero, a read error of the data DQ may take place. Thus, when one of the margin times decreases, the yield of the circuit boards on which the semiconductor devices are mounted degrades.

(C) Adjusting Operation for Resolving the Above-described Problem

To solve the problem, the value L2 of the load of the dummy load circuit 31x is determined as a value shifted by the value ΔL from the proper value L1 of the load in the case that the access time ta does not depend on the frequency of the data DQ, where ΔL corresponds to substantially a half of the maximum value of the deviation of the access time ta that varies corresponding to the frequency of the data DQ. Under this condition of L2=L1−ΔL, the DDL circuit 40 is operated so as to adjust the delay time of the delay circuit 32. Namely, the delay adjusting circuit 39 controls the delay time of a delay circuit 32 so that the difference between the phases of the clock d_iCLK and iCLK becomes a predetermined value.

In the adjustment, the frequencies of the data DQ and the dummy data d_DQ are decreased so that they can fully swing. For example, the data DQ and the dummy data d_DQ is inverted every four cycles of the external clock CLK.

To satisfy the relation of L2=L1−ΔL, in FIGS. 2 and 3(B), the dummy load adjustment data is determined as follows. In this case, it is assumed that CY4 is the most significant bit.

$CY$="0001" for $CN \geq 8$ (1)

$CY$="0011" for $CN=7$ (2)

$CY$="0111" for $CN=6$ (3)

$CY$="1111" for $CN=5$ (4)

The load capacitances of the dummy load circuit 31x of the LVTTL interface in the cases (1) to (4) are C1, C1+C2, C1+C2+C3 and C1+C2+C3+C4, respectively. The capacitors C2 to C4 are determined so that the relation L2=L1−ΔL is satisfied.

Figure 8A:
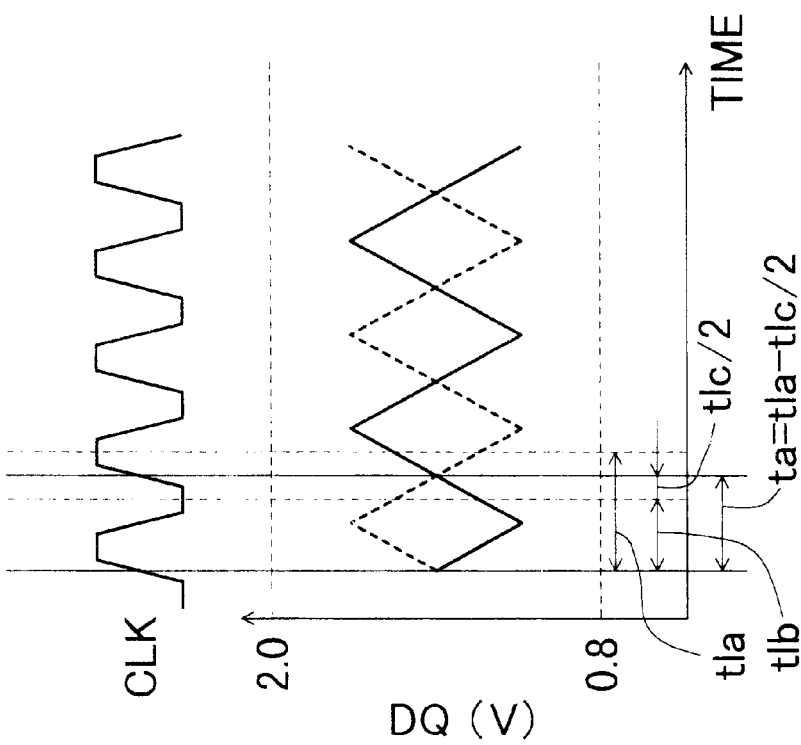
FIG. 8(A) is a schematic diagrams showing waveforms of a clock CLK and data DQ after adjustment in the case a cycle time of the data DQ is twice that of the clock CLK.
Figure 8B:
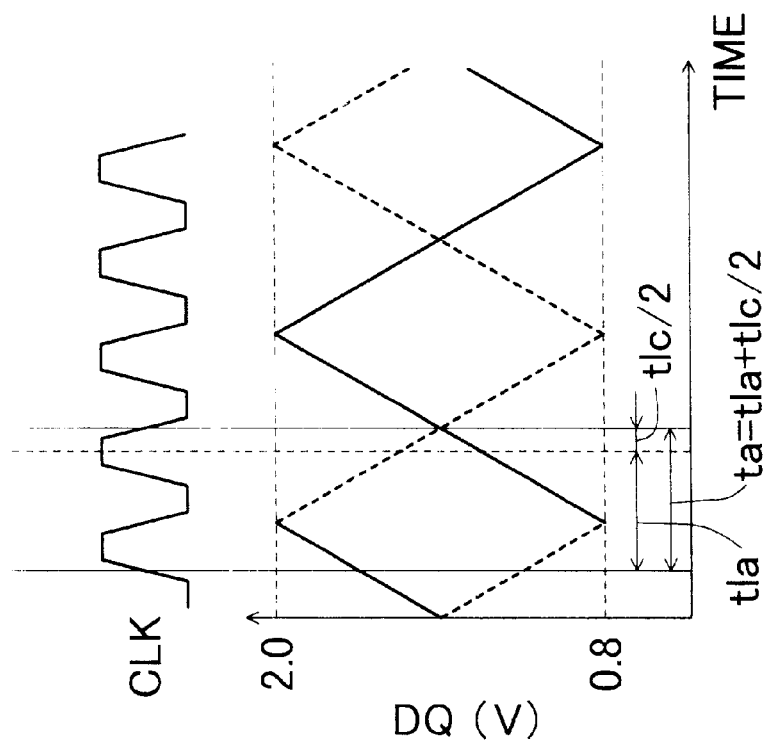
FIG. 8(B) is a schematic diagrams showing waveforms of a clock CLK and data DQ after adjustment in the case a cycle time of the data DQ is the same as that of the clock CLK.
Figure 10:
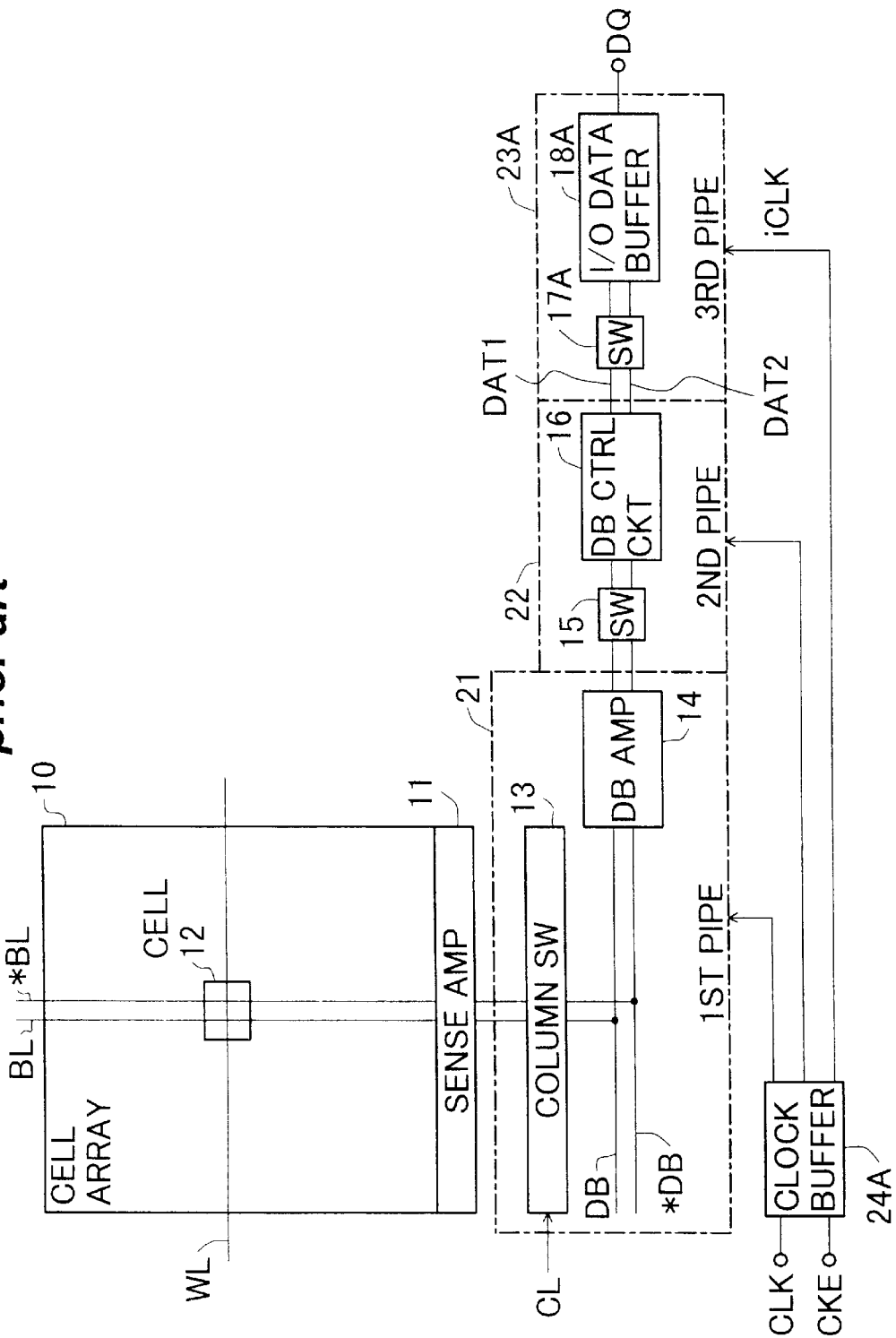
FIG. 10 is a schematic block diagram showing a prior art synchronous DRAM.

FIGS. 8(A) and 8(B) show the schematic waveforms of the external clock CLK and the data DQ a after such an adjustment has been automatically performed by the DLL circuit 40. FIGS. 8(A) and 8(B) show the case that the phase difference adjusted by the delay control circuit 39 is π.

FIG. 8A show s the case where the cycle time of the data DQ is twice that of the external clock CLK, namely the data DQ varies such that "H", "H", "L", "L", "H", . . . with CLK and the data DQ fully swings. FIG. 8B shows the case where the cycle time of the data DQ is the same as that of the external clock CLK, namely the data DQ varies such that "H", "L", "H", "L", ... with CLK and the data DQ does not fully swing. FIG. 7 is a time chart in the state that the adjustment has been completed.

In the case of FIG. 7 as well, the above-described (i) to (iii) hold. Owing to (i) and (ii), the relation of phases of the internal clock iCLK, the dummy internal clock d_iCLK and the dummy data d_DQ are the same as those shown in FIG. 6.

Due to the relation L2=L1−ΔL, the relation δtD−ΔtD= tlc/2 holds. With this and (iii), the relation of phases of the internal clock jCLK and change points of the data DQ and d_DQ is determined as shown in FIG. 7.

In the case of FIG. 7, δtD is the same as that of FIG. 6. In other words, ΔtD is shorter than that of FIG. 6 by tlc/2. In each of FIGS. 6 and 7, Δti+δtx+Δtw+δtD is equal to a cycle time of the clock CLK. Accordingly, δtx of FIG. 7 is larger than that of FIG. 6 by tlc/2. Thus, as shown in FIG. 7, the rise of the internal clock jCLK delays from that of FIG. 6 by tlc/2, and in the case of FIG. 8(A), ta=tla+tlc/2 holds In the case of FIG. 8(B), since δtD is shorter than the case of FIG. 6 by tlc, ta=tla−tlc/2 holds.

As a result, the margin of the hold time tH of FIG. 13 is longer by tlc/2 than the case that the access time ta is not adjusted further by tlc/2 . Although the margin of the setup time tS of FIG. 13 is longer by tlc/2 than the case that the access time is not adjusted further by tlc/2 , the margin of the setup time tS is balanced with that of the hold time tH. Therefore, the margin time substantially increases, improving the yield of circuit boards on which the semiconductor devices are mounted.

Another effect is as follows. Actually, due to an adjustment error of the DLL circuit 40, the dead band is present after the adjustment even if the data DQ is a low frequency. On the other hand, after the above-described adjustment, positive and negative jitters irregularly take place in the data DQ corresponding to an irregular variation of the data frequency. Thus, both types of the jitters may cancel out to each other. Oppositely, when the access time is not adjusted further by tlc/2 , corresponding to the irregular variation of the data frequency, larger negative jitters irregularly take place in the data DQ. Thus, when the access time is adjusted further by tlc/2 , the dead band of FIG. 13 can be decreased from the case that the access time is not adjusted further by tlc/2.

The relation L2=L1−ΔL is satisfied by another method which determines the delay time δtx of as follows:
(i) Determining the delay time δtx0 of δtx with activating the DLL circuit 40 in a low frequency of the data DQ,
(ii) determining substantially a half of the maximum value of the deviation of the access time ta as tlc/2 that varies corresponding to the frequency of the data DQ,
(iii) finally determining δtx as δtx=δtx0+tlc/2.

This means that an addition of the delay time at the delay circuit 32 by tlc/2 is equivalent to a subtraction of the dummy load by ΔL at the dummy load circuit 31x.

Second Embodiment

In the adjustment of item (C), the frequencies of the data DQ and the dummy data d_DQ may be inverted every pulse of the external clock in a high frequency, namely at the maximum data frequency.

In this case, the value L2 of the load of the dummy load circuit 31x is determined as a value shifted by the value ΔL from the proper value L1 of the load in the case that the access time ta does not depend on the frequency of the data DQ, where ΔL corresponds to substantially a half of the maximum value of the deviation of the access time ta that varies corresponding to the frequency of the data DQ. Under this condition of L2=L1+ΔL, the DDL circuit 40 is operated so as to adjust the delay time of the delay circuit 32. Namely, the delay adjusting circuit 39 controls the delay time of a delay circuit 32 so that the difference between the phases of the clock d_iCLK and iCLK becomes a predetermined value.

Namely, with setting L2=L1+ΔL, the DDL circuit 40 is operated so as to adjust the delay time of the delay circuit 32.

FIG. 9 is a time chart corresponding to FIG. 7 in the state that this adjustment has been completed. The delay time δtD of FIG. 9 is shorter than that of FIG. 7 by tlc. The delay time δtx of FIG. 9 is the same as that of FIG. 7. Thus, the same adjustment results as the first embodiment.

As a frequency determining circuit, the shift register 391 of FIG. 4(A) may be used with treating the parallel output data thereof as frequency determination data CN. This is possible because after the adjustment, the content of the shift register 391 corresponds to the frequency of the clock CLK.

In this case, for example, with the output value of the load adjusting circuit 36 being fixed, adjustment is performed by the DLL circuit 40 in the first adjusting stage until the content of the shift register 391 becomes stable in order to obtain the content of the shift register 391 corresponding to the frequency of the clock CLK. In the second adjusting stage, adjustment is performed by the DLL circuit 40 with releasing the above fixed output value of the load adjusting circuit 36.

The relation L2=L1+ΔL is satisfied by another method which determines the delay time δtx as follows:
(i) Determining the delay time δtx1 of δtx with activating the DLL circuit 40 in a high frequency, namely at the maximum frequency of the data DQ,
(ii) determining substantially a half of the maximum value of the deviation of the access time ta as tlc/2 that varies corresponding to the frequency of the data DQ,
(iii) finally determining δtx as δtx=δtx1−tlc/2 .

As δtx1=δtx0+tlc, δtx=δtx1−tlc/2=δtx0−tlc/2 holds, which is the same as that in the first embodiment.

Although preferred embodiments of the present invention has been described, it is to be understood that the invention is not limited thereto and that various changes and modifications may be made without departing from the spirit and scope of the invention.

For instance, since only the total delay time of the dummy circuit is significant, the order of the connections of the dummy output circuit 33, the dummy load circuit 31x and the dummy input circuit 34 is not restricted as long as these circuits are cascaded. Part of the load of the dummy load circuit 31x may be separated with the separated load being connected to the output stage of the dummy input circuit 34 or to the control input stage of the dummy output circuit 33. Alternatively, a load corresponding to the delay of the dummy input circuit 34 and the dummy output circuit 33 may be added to the dummy load circuit 31x without the dummy input circuit 34 and the dummy output circuit 34.

In FIG. 2, the structure in which the capacitance is adjusted by changing the number of capacitors connected in parallel was shown. Alternatively, the capacitance may be adjusted by changing the number of capacitors connected in series. In the above description, for simplicity, the load consists of only capacitors. However, in FIG. 2, since each transistor has an ON resistance, the impedance of the dummy load circuit 31x may be adjusted corresponding to the impedance of the load 31a.

In addition, the present invention can be applied to the structure in which the frequency of the external clock CLK provided to the semiconductor device 30 is fixed or to the structure in which the number of output interfaces is only one. In this case, the interface determining circuit 35, the frequency determining circuit 37, and the load adjusting circuit 36 can be omitted.

The adjustment by the DLL circuit 40 may be performed only before the semiconductor device 30 is shipped and at this stage, the delay amount of the dummy load circuit 32 may be fixed by a fuse disconnection or the like. In this case, the dummy load circuit 30x is used only when the adjustment is performed. Therefore, the delay adjusting circuit 39 and the phase comparator circuit 38 of the DLL circuit 40 may be disposed outside the semiconductor device 30. In addition, the dummy load circuit 31x of FIG. 2 may consist of only the transistors 310 and 311 and the capacitors C0 and C1, the difference tlc of the access time may be measured in the case of the above-described high frequency, and the delay time of the delay circuit 32 adjusted by the DLL circuit 40 may be decreased by tlc/2.

What is claimed is:

1. An access time adjusting method for a semiconductor device provided with an input circuit for providing a first internal clock in response to an external clock; a variable delay circuit for delaying said first internal clock by a delay time to provide a delayed first internal clock as a second internal clock; and an output circuit for outputting data in synchronization with said second internal clock, said method comprising the steps of:

providing a) a dummy circuit, having a dummy loads, for providing a delayed second internal clock in response to said second internal clock as a dummy clock; b) a phase comparator circuit for comparing a phase of said first internal clock with a phase of said dummy clock; and c) a delay adjusting circuit for adjusting said delay time so that a difference between said phases of said first internal clock and said dummy clock becomes a predetermined value;

determining a value L2 of said dummy load as a value shifted by a shift value ΔL from a proper value L1 of said dummy load when an access time ta does not depend on a frequency of said data, where said shift value ΔL corresponds to substantially a half of a maximum value of deviations of said access time that varies depending on said frequency of said data; and when said dummy load is set to said value L2, activating said phase comparator circuit and said delay adjusting circuit to determine said delay time of said variable delay circuit.

2. An access time adjusting method for a semiconductor device provided with an input circuit for providing a first internal clock in response to an external clock; a variable delay circuit for delaying said first internal clock by a delay time to provide a delayed first internal clock as a second internal clock; and an output circuit for outputting data in synchronization with said second internal clock, said method comprising the steps of:

providing a) a dummy circuit, having a dummy loads for providing a delayed second internal clock in response to said second internal clock as a dummy clock; b) a phase comparator circuit for comparing a phase of said first internal clock with a phase of said dummy clock; and c) a delay adjusting circuit for adjusting said delay time so that a difference between said phases of said first internal clock and said dummy clock becomes a predetermined value;

determining said delay time as a first value with activating said phase comparator circuit and said delay adjusting circuit;

determining a maximum value of deviations of an access time that varies depending on a frequency of said data; and determining said delay time as a value shifted by substantially a half of said maximum value from said first value.

3. A semiconductor device comprising:

an input circuit for providing a first internal clock in response to an external clock;

a variable delay circuit for delaying said first internal clock by a delay time to provide a delayed first internal clock as a second internal clock; and an output circuit for outputting data in synchronization with said second internal clock;

a dummy circuit, having a dummy load, for providing a delayed second internal clock in response to said second internal clock as a dummy clock;

wherein said delay time is substantially equal to a value determined in such a way that said delay time is determined as a first value with activating a delay locked loop circuit including said variable delay circuit, a maximum value of deviations of an access time that varies depending on a frequency of said data is determined and said delay time is determined as a value shifted by substantially a half of said maximum value from said first value.

4. A semiconductor device comprising:

an input circuit for providing a first internal clock in response to an external clock;

an output circuit for outputting data in synchronization with a second internal clock; and a dummy circuit, having a dummy load, for providing a delayed second internal clock in response to said second internal clock as a dummy clock; and a delay locked loop circuit for delaying said first internal clock by a delay time so that a difference between phases of said first internal clock and said dummy clock becomes a predetermined value and for providing a delayed first internal clock as said second internal clock, wherein said delay time is substantially equal to a value determined in such a way that said delay time is determined as a first value with activating said delay locked loop circuit, a maximum value of deviations of an access time that varies depending on a frequency of said data is determined and said delay time is determined as a value shifted by substantially a half of said maximum value from said first value.

5. A semiconductor device according to claim 4, further comprising:

a frequency determining circuit for determining a frequency of said external clock CLK; and a load adjusting circuit for adjusting a value of said dummy load corresponding to said determined frequency.

6. A semiconductor device according to claim 5, wherein said frequency determining circuit includes:

a monostable multivibrator; and a counter for counting a clock while an output of said monostable multivibrator is active.

7. A semiconductor device according to claim 6, wherein said dummy circuit includes:

a plurality of load elements, and a switching circuit for selecting a combination of said load elements to determine a value of said dummy load, wherein said load adjusting circuit includes:

a code converting circuit for converting a count of said counter; and a logic circuit for controlling said switching circuit corresponding to an output value of said code converting circuit.

8. A semiconductor device according to claim 5, wherein said output circuit receives an interface determination signal for selecting an interface thereof, said semiconductor device further comprise an interface determining circuit for determining a selected interface and providing said interface determination signal indicating said selected interface, and wherein said load adjusting circuit adjusts said value of said dummy load depending on outputs of said frequency determining circuit and said interface determining circuit.

9. A semiconductor device according to claim 4, wherein said dummy circuit includes:

a dummy output circuit with a delay time that is substantially equal to that of said output circuit;

a dummy load circuit having said dummy load; and a dummy input circuit with a delay time that is substantially equal to that of said input circuit;

wherein said dummy output circuit, said dummy load circuit and said dummy input circuit are cascaded.

10. A semiconductor device according claim 4, wherein said delay locked loop circuit includes:

a phase comparator circuit for detecting whether said phase of said dummy clock advances to, delays from, or matches with said phase of said first internal clock;

a variable delay circuit for delaying said first internal clock by said delay time to provide a delayed first internal clock as said second internal clock; and a delay adjusting circuit for adjusting so that said phase comparator detects matching.

11. A semiconductor device comprising:

an input circuit for providing a first internal clock in response to an external clock;

an output circuit for outputting data in synchronization with a second internal clock; and a dummy circuit, having a dummy load, for providing a delayed second internal clock in response to said second internal clock as a dummy clock; and a delay locked loop circuit for delaying said first internal clock by a delay time so that a difference between phases of said first internal clock and said dummy clock becomes a predetermined value and for providing a delayed first internal clock as said second internal clock, wherein a value of said dummy load based upon a shift value corresponding to substantially a half of a maximum value of deviations of an access time that varies depending on a frequency of said external clock.

12. A semiconductor device comprising:

an output circuit outputting an output signal in response to a timing clock; and a phase adjustment circuit receiving an external clock to supply said timing clock; said phase adjustment circuit including:

a variable delay circuit delaying a first input clock from said external clock to output said timing clock;

a dummy output circuit outputting a dummy clock in response to said timing clock;

a dummy load coupled to an output node of said dummy output circuit;

a delay control circuit controlling a delay time in said variable delay circuit in response to a phase comparison between said first input clock and a second input clock from said dummy clock;

a frequency judgement circuit measuring a frequency of said external clock to output a frequency judgement signal; and a load adjustment circuit adjusting a load value of said dummy load in response to said frequency judgement signal.

13. The semiconductor device according to claim 12, further comprising:

an output interface judgement circuit judging a level at an external terminal to output an output interface signal;

wherein said load adjustment circuit adjusting said load value of said dummy load in response to said frequency judgement signal and said output interface signal.

14. The semiconductor device according to claim 12, wherein said external clock has a first frequency in which said output signal has a first amplitude or a second frequency, higher than said first frequency, in which said output signal has a second amplitude smaller than said first amplitude, and wherein said load value corresponding to said second frequency is smaller than that corresponding to said first frequency.

15. The semiconductor device according to claim 12, wherein said dummy output circuit has an output delay time which is the substantially same as that in said output circuit.

16. The semiconductor device according to claim 12, said dummy load comprising:

a plurality of capacitors; and a plurality of switches, each disposed between said output node of said dummy output circuit and corresponding one of said plurality of capacitors;

wherein said load adjustment circuit selecting said plurality of switches in response to said frequency judgement signal.

17. The semiconductor device according to claim 12, wherein said frequency judgement circuit comprising:

a clock counter a counting number of clock pulses of said external clock during a reference period to output a count signal as said frequency judgement signal.

* * * * *